United States Patent
Lin et al.

(10) Patent No.: US 9,218,970 B2
(45) Date of Patent: *Dec. 22, 2015

(54) STRESS-CONTROLLED FORMATION OF TIN HARD MASK

(71) Applicant: Taiwan Semiconductor Manufacturing Company, Ltd., Hsin-Chu (TW)

(72) Inventors: Rueijer Lin, Hsinchu (TW);
Chun-Chieh Lin, Taichung (TW);
Hung-Wen Su, Jhubei (TW);
Ming-Hsing Tsai, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/642,968

(22) Filed: Mar. 10, 2015

(65) Prior Publication Data

US 2015/0187579 A1 Jul. 2, 2015

Related U.S. Application Data

(63) Continuation of application No. 13/925,495, filed on Jun. 24, 2013, now Pat. No. 8,975,187.

(60) Provisional application No. 61/799,898, filed on Mar. 15, 2013.

(51) Int. Cl.
*H01L 21/311* (2006.01)
*H01L 21/033* (2006.01)
(Continued)

(52) U.S. Cl.
CPC ........ *H01L 21/0332* (2013.01); *B81C 1/00246* (2013.01); *H01L 21/02175* (2013.01);
(Continued)

(58) Field of Classification Search
CPC .................. B81B 2207/015; B81B 2207/096; B81C 1/00246; B81C 2203/0118; B81C 2203/0742; B81C 2203/0778; H01L 21/3081
See application file for complete search history.

(56) References Cited

U.S. PATENT DOCUMENTS

| | | | |
|---|---|---|---|
| 4,676,866 A | 6/1987 | Tang et al. | |
| 5,840,628 A | 11/1998 | Miyamoto | |

(Continued)

FOREIGN PATENT DOCUMENTS

| | | |
|---|---|---|
| KR | 100195681 | 2/1999 |
| KR | 20010112871 | 12/2001 |

(Continued)

OTHER PUBLICATIONS

Notice of Allowance received Mar. 3, 2015, Korean Application No. 10-2013-0129760, 3 pages.

*Primary Examiner* — Marvin Payen
*Assistant Examiner* — Victor Barzykin
(74) *Attorney, Agent, or Firm* — Haynes and Boone, LLP (57) ABSTRACT

A method to form a titanium nitride (TiN) hard mask in the Damascene process of forming interconnects during the fabrication of a semiconductor device, while the type and magnitude of stress carried by the TiN hard mask is controlled. The TiN hard mask is formed in a multi-layered structure where each sub-layer is formed successively by repeating a cycle of processes comprising TiN and chlorine PECVD deposition, and $N_2/H_2$ plasma gas treatment. During its formation, the stress to be carried by the TiN hard mask is controlled by controlling the number of TiN sub-layers and the plasma gas treatment duration such that the stress may counter-balance predetermined external stress anticipated on a conventionally made TiN hard mask, which causes trench sidewall distortion, trench opening shrinkage, and gap filling problem.

20 Claims, 4 Drawing Sheets (51) Int. Cl.
*H01L 21/308* (2006.01)
*B81C 1/00* (2006.01)
*H01L 21/02* (2006.01)
*H01L 21/768* (2006.01)

(52) U.S. Cl.
CPC .... *H01L21/02178* (2013.01); *H01L 21/02186* (2013.01); *H01L 21/02247* (2013.01); *H01L 21/02274* (2013.01); *H01L 21/02337* (2013.01); *H01L 21/3081* (2013.01); *H01L 21/31111* (2013.01); *H01L 21/31144* (2013.01); *H01L 21/76802* (2013.01); *B81B 2207/015* (2013.01); *B81B 2207/096* (2013.01); *B81C 2203/0118* (2013.01); *B81C 2203/0742* (2013.01); *B81C 2203/0778* (2013.01)

(56) References Cited

U.S. PATENT DOCUMENTS

| | | | |
|---|---|---|---|
| 6,207,557 | B1 | 3/2001 | Lee et al. |
| 6,291,342 | B2 | 9/2001 | Lee et al. |
| 6,548,395 | B1 | 4/2003 | Woo et al. |
| 6,617,231 | B1 | 9/2003 | Griffin et al. |
| 7,314,813 | B2 | 1/2008 | Su et al. |
| 8,975,187 | B2 * | 3/2015 | Lin et al. ........................ 438/702 |
| 2004/0235191 | A1 | 11/2004 | Hasegawa |
| 2005/0112876 | A1* | 5/2005 | Wu et al. ........................ 438/685 |
| 2006/0094232 | A1 | 5/2006 | Su et al. |
| 2008/0122125 | A1 | 5/2008 | Zhou |
| 2008/0200026 | A1 | 8/2008 | Koh et al. |
| 2012/0088371 | A1 | 4/2012 | Ranjan et al. |
| 2012/0115331 | A1* | 5/2012 | Koh et al. ........................ 438/694 |
| 2014/0017894 | A1 | 1/2014 | Tsai et al. |
| 2014/0264475 | A1 | 9/2014 | Lin |

FOREIGN PATENT DOCUMENTS

| | | |
|---|---|---|
| KR | 20020002741 | 1/2012 |
| KR | 1020130026266 | 3/2013 |

* cited by examiner

STRESS-CONTROLLED FORMATION OF TIN HARD MASK

PRIORITY DATA

The present application is a continuation application of U.S. patent application Ser. No. 13/925,495, filed Jun. 24, 2013, which claims priority to U.S. Provisional Application No. 61/799,898, filed on Mar. 15, 2013, each of which is incorporated herein by reference in its entirety.

BACKGROUND

The semiconductor integrated circuit (IC) industry has experienced exponential growth. Technological advances in IC materials and design, and nanometer technology have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs, but also increases the complexity of processing and manufacturing ICs and castes challenges on both fabrication and design.

For the next technological generations of integrated circuits, the traditional challenges faced such as profile control, etch selectivity, critical dimensions, uniformity, defects, etc. become more difficult, intensified by the use of new materials, the limitations of lithography, and the recent introduction of new device structures and integration schemes. Particularly in the field of the interconnect fabrication, where dual-damascene patterning is performed by etching trenches and vias in porous low-k dielectrics, the main challenges are in controlling the profile of the etched structures, minimizing plasma-induced damage, and controlling the impact of various types of etch stops and hard mask materials. With shrinking geometries as technology nodes advance to 45 nm and beyond, and with adoption of lower k dielectrics and thinner barriers to minimize device RC (the time constant, R: resistance, C: capacitance) delay, there is a need for advanced patterning schemes to obtain reliable, high yield and low-resistance interconnects. Since it is difficult to make the photoresist (PR) films used in semiconductor fabrication thinner to etch sub-45 nm devices, a metal or ceramic hard mask film, such as titanium nitride ("TiN"), came to be widely used, instead of the conventional $SiO_2$ hard mask, for its hardness and different etching selectivity to oxide films of low k materials during Cu dual damascene patterning. A TiN hard mask further allows partial via etch approach and eliminates ultra-low K damage caused by the resist ash strip process.

Despite various advantages with the TiN hard mask, a problem has been noted. When a TiN hard mask is formed by a conventional PVD (Physical Vapor Deposition) or CVD (Chemical Vapor Deposition), it has been observed that, after patterning narrow trenches for interconnects, and especially after deposition of an anti-diffusion barrier film upon the trench sidewalls that have a TiN hard mask formed at its top, the trench sidewalls suffer from high stress, and end up with profile distortions, which causes shrinkage of the trench openings or via openings. When the trench openings shrink, interconnect metals such as copper cannot fully fill the trenches, creating so-called Cu voids in the interconnects or vias, impairing the interconnect reliability and via RC yield. The stress causing such distortions may be attributed to the highly compressive residual stress in the TiN hard mask, which originates partly from the TiFx compounds which settle on the trench sidewalls, and partly from the deposited anti-diffusion barrier film.

Therefore, for improving the interconnect reliability and via RC yield that suffer from the copper void problem caused by the trench/via opening shrinkage, there is a need to provide a method for forming a metallic or ceramic hard mask, such as a TiN hard mask, in fabricating semiconductor device, especially in forming metallic interconnects, in such a way to control internal stress of the hard mask to counter-balance the residual stress that causes the profile distortion.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Figure 1:
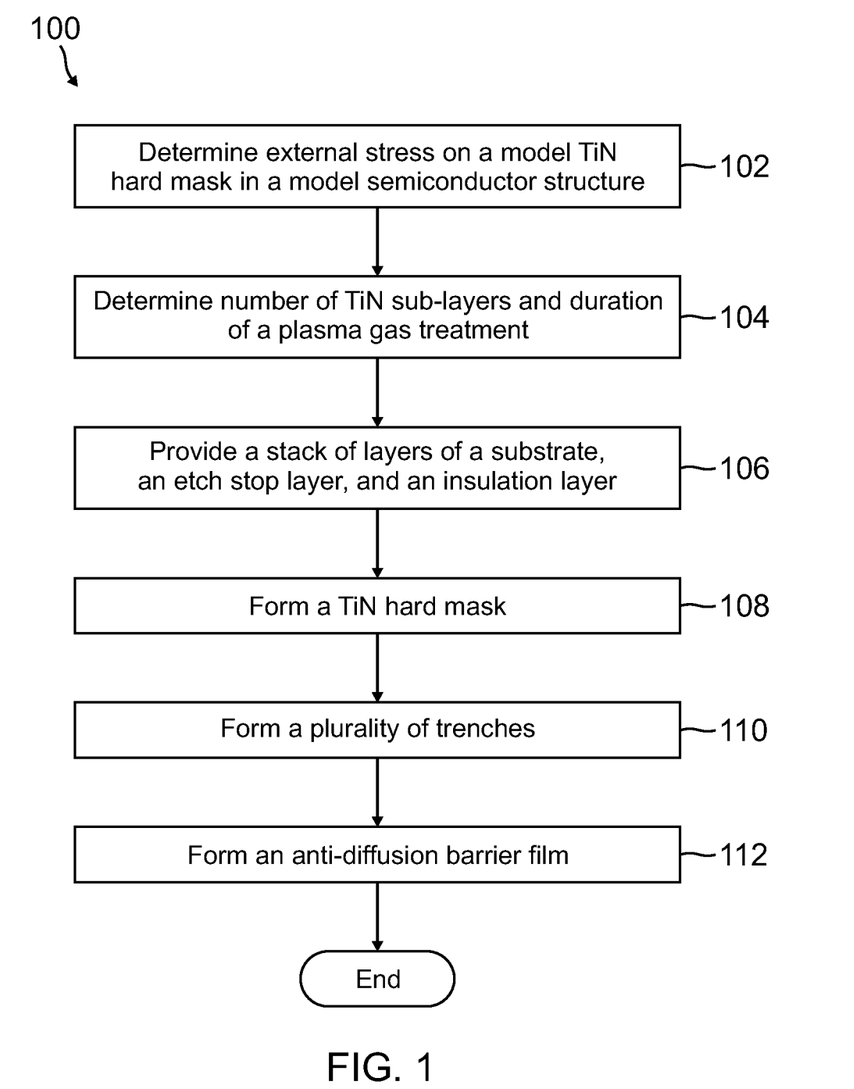
FIG. 1 is a flowchart of a process for fabricating a semiconductor device, including steps for forming a stress-controlled TiN hard mask, in accordance with aspects of the present disclosure.

FIG. 1 is a flowchart of a process 100 for fabricating a semiconductor device in accordance with aspects of the present disclosure. Particularly, the process 100 is directed to forming a metallic or ceramic hard mask such as titanium nitride (TiN), which is formed before a Damascene process of patterning trenches for constructing interconnects. In the process 100, a TiN hard mask is formed, not by a conventional deposition, such as a physical vapor deposition (PVD) process as employed in the current art, but in a way that the hard mask formed may have internal stress of a desired type, i.e., between compressive and tensile, and a desired magnitude such that the resulting internal stress may counter-balance expected external stress that would otherwise cause trench sidewall distortions.

The process 100 begins at step 102, where the external stress exerted on a model TiN hard mask in a model semiconductor structure is determined. The model semiconductor structure can be constructed in various ways, such as a software model of test data from previously fabricated devices, a software model of test data from specific processing machines or groups of machines, or an actual test device. The model semiconductor structure includes a plurality of trenches and trench sidewalls patterned by photolithography. The plurality of trench sidewalls interweave the plurality of trenches that are defined into an insulating layer to be subsequently filled with metal such as copper to form an interconnect level. Some trenches are defined deeper than the rest, defined past an etch stop layer formed below the insulating layer and reaching down another level of metal interconnects to form vias/contacts.

The model TiN hard mask is located near the top of each trench sidewall, and formed by a conventional method of deposition, such as a PVD process. The model semiconductor structure further has an anti-diffusion barrier film formed over the model TiN hard mask on each trench sidewall, and on each trench. The anti-diffusion barrier film is deposited after formation of the trenches, but before filling of metal into the trenches. A detailed description of the process of forming the model semiconductor structure will be given hereinafter in describing subsequent steps of the process 100 in the present disclosure, as the model semiconductor device referred to at step 102 has a similar structure as the semiconductor device to be fabricated by a process 100 except for the structure of the TiN hard mask.

At step 202, the external stress is determined. This can be done, for example, by direct measurement of the degree of distortion or tilt of the trench sidewalls, in the pre-fabricated or currently fabricated model semiconductor structure by a suitable measurement device. Other methods known in the art for measuring stress may be utilized. From the measurement, the type of external stress, i.e., whether the stress is compressive or tensile, and the magnitude of the external stress, may be determined. The method and facility of measuring and determining/calculating stress acting on a physical structure is well known in the art, and thus, not further described herein. In general, the type and magnitude of the external stress applying on a TiN hard mask of a trench sidewall may vary depending on various structural factors of a model semiconductor structure. Such factors may include the thickness of the TiN hard mask, the width and depth of the trench sidewalls, the kind of anti-diffusion barrier material and its thickness, etc. Therefore, it is understood that the particular type and magnitude of the external stress determined at step 102 are only specific to a particular set of factors for a given model semiconductor structure, and may change if those factors change.

At step 104, the number of sub-layers to be formed in the TiN hard mask, and the duration of a plasma gas treatment to be performed in the formation of each sub-layer, are determined. In the process of the present disclosure, the TiN hard mask is formed as multi-layers, wherein each sub-layer is formed by depositing not only TiN, but also other materials such as chlorine, and further, by performing a plasma treatment on each layer. In the present embodiment, the TiN hard mask is formed by multiple cycles of processes where each cycle comprises two processes: 1) deposition of TiN mixed with chlorine to form a sub-layer, and 2) application of a plasma treatment to the formed sub-layer to control the chlorine concentration in the TiN sub-layer. In an embodiment, the TiN and chlorine are deposited by a PECVD (plasma-enhanced chemical vapor deposition) process. Also, in an embodiment, the plasma treatment is performed with nitrogen ($N_2$) and hydrogen ($H_2$) gas mixture wherein the TiN sub-layers including chlorine are exposed to the $N_2/H_2$ plasma in a plasma chamber for nitridation.

In the present disclosure, it is shown that the internal stress of the formed TiN hard mask depends on the number of TiN sub-layers, or equivalently the number of cycles, and the chlorine concentration in the TiN sub-layer. Therefore, by controlling the number of TiN sub-layers and the chlorine concentration in the TiN sub-layer in each cycle, which depends on the duration of a plasma treatment, the internal stress of the TiN hard mask can be controlled as desired, both in its type and magnitude, during the formation of the TiN hard mask. The desired internal stress of a fabricated TiN hard mask is the one that would counter-balance the external stress expected to be applied to the TiN hard mask, which has been determined in the previous step of 102. For example, if the external stress expected on the TiN hard mask is a compressive stress of a certain magnitude, the desired internal stress carried by the TiN hard mask to be formed by the process 100 should be a tensile stress of an equal magnitude.

Figure 2:
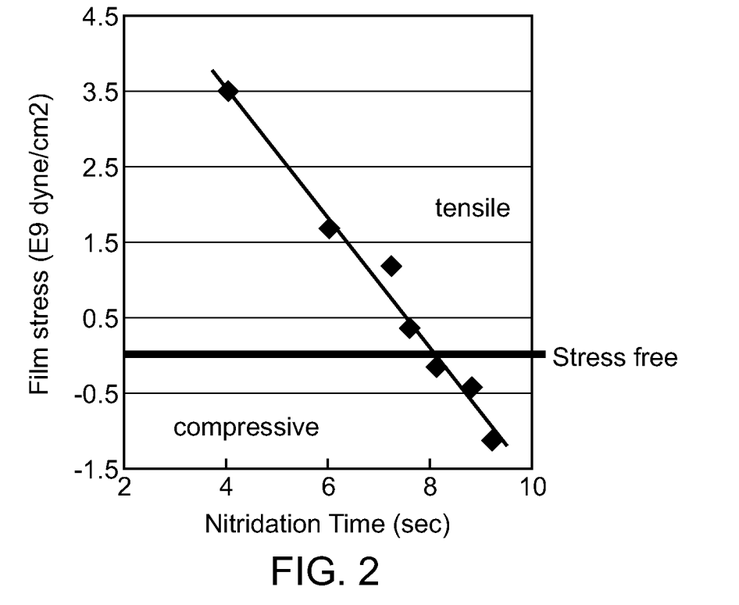
FIGS. 2, 3A, and 3B show relations of internal stress of a TiN hard mask with: the duration of $N_2/H_2$ plasma gas treatment (nitridation time), a chlorine concentration in the TiN hard mask, and the number of TiN sub-layers (the number of cycles), respectively, in accordance with aspects of the present disclosure.
Figure 3A:
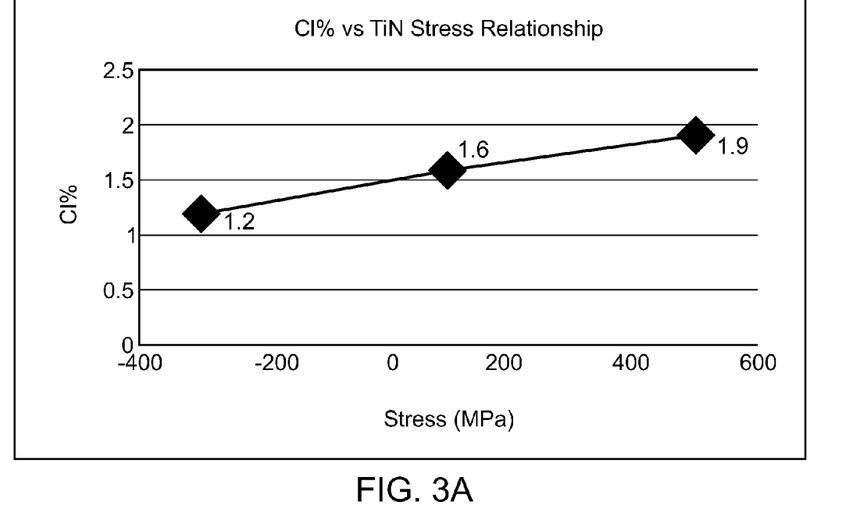
Figure 3B:
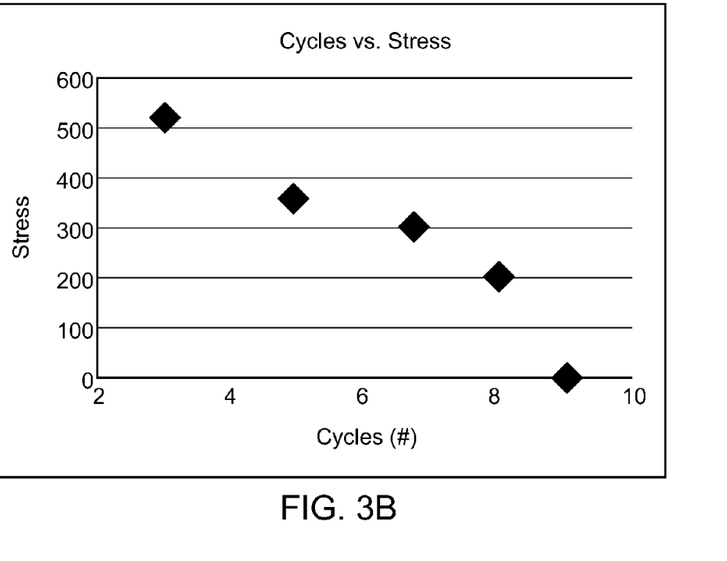

FIGS. 2, 3A, and 3B show various relations of the internal stress of a TiN hard mask with the duration of $N_2/H_2$ plasma gas treatment (nitridation time), with the chlorine concentration in the TiN hard mask, and with the number of TiN sub-layers (the number of cycles). From these relations, the control parameters, i.e., the duration of $N_2/H_2$ plasma gas treatment (nitridation time), which controls the chlorine concentration in the TiN hard mask, and the number of TiN sub-layers, can be determined at step 104 so as to produce internal stress of a desired type and magnitude when a TiN hard mask is subsequently formed in accordance with the control parameters so determined.

More specifically, FIG. 2 plots, in one embodiment, the stress of a TiN sub-layer versus the $N_2/H_2$ plasma treatment duration (or nitridation time) in each cycle. FIG. 2 shows that as the nitridation time increases, the stress changes from tensile stress where it has a positive value, to a compressive stress where it has a negative value. FIG. 3A plots, in one embodiment, the stress of a TiN sub-layer versus the chlorine concentration contained in the TiN hard mask. In this particular embodiment, nine TiN sub-layers were formed by nine cycles of PECVD deposition and $N_2/H_2$ plasma treatment. It can be observed that as the chlorine concentration increases, for example, greater than ~1.4% in the particular embodiment illustrated in FIG. 3A, the stress of the TiN hard mask turns from compressive to tensile. FIG. 2 and FIG. 3A can be understood consistently as follows. As noted above, the $N_2/H_2$ plasma treatment duration (or nitridation time) in each cycle is closely related with the chlorine concentration. The hydrogen plasma gas in the $N_2/H_2$ plasma mixture, on the one hand, makes the formation of the TiN sub-layer more stable, but on the other hand, chemically reacts with the chlorine in the TiN sub-layer to form hydrogen chloride (HCl), thereby to reduce the chlorine concentration in the TiN sub-layer. One of the roles of the nitrogen gas is to fill in where the chlorine is depleted in the in the TiN sub-layer. Increasing the plasma treatment duration, the nitridation time, increases the chemical reaction of depleting the chlorine, and hence reduces the chlorine concentration. Therefore, the behavior of the internal stress of the TiN hard mask, shown in FIG. 2, i.e., changing from tensile to compress with the increase of the plasma treatment duration, can be consistently understood in light of FIG. 3A, which shows that the corresponding reduction of the chlorine concentration affects the internal stress of the TiN hard mask to change from tensile to compress.

Another parameter affecting the internal stress of the TiN hard mask is the number of sub-layers or the number of process cycles. FIG. 3B shows their relation in one embodiment of the present disclosure, which was obtained with changing the number of sub-layers while all other factors, such as the total deposition time of TiN and chlorine, the plasma treatment duration per each cycle, and the total chlorine amount, being fixed. Fixing the total deposition time of TiN and chlorine fixes the total thickness of the TiN hard mask. Therefore, as the number of sub-layers increases in FIG. 3B, the individual thickness of one sub-layer must decreases. And the thinner a TiN sub-layer becomes, the more effective the $N_2/H_2$ plasma treatment becomes because more inner portions of the TiN hard mask is exposed to the plasma gas for chemical reaction. Since the plasma treatment operates to reduce the chlorine concentration, and change the internal stress from tensile to compress, the observation in FIG. 3B that the internal stress of the TiN hard mask turns from tensile to compressive with increase of the number of sub-layers or process cycles can be explained and understood. Further, in the particular embodiment illustrated in FIG. 3B, it can be seen that when the number of the TiN sub-layer is between three and nine, the internal stress of the TiN hard mask can be controlled to be tensile with varying magnitudes.

FIGS. 2-3B demonstrate how the internal stress of the TiN hard mask can be controlled, in either its type between compressive and tensile or its magnitude, by controlling the stress control parameters such as the duration of $N_2/H_2$ plasma gas treatment (nitridation time), the chlorine concentration, and the number of TiN sub-layers (the number of cycles). As noted above, the chlorine concentration appears to be the controlling parameter to determine the internal stress, which can be affected and controlled by either adjusting the duration of $N_2/H_2$ plasma gas treatment or the number of TiN sub-layers. The total deposition time/rate of TiN and chlorine, which would determine the total thickness of the TiN hard mask and the total chlorine amount contained therein would also be the factors affecting the internal stress. These include factors such as the total deposition time/rate of TiN and chlorine, the duration of $N_2/H_2$ plasma gas treatment and the number of TiN sub-layers can be determined at step 104 to obtain a desired type and magnitude of an internal stress that would counter-balance the expected external stress applied on the TiN hard mask.

Referring back to FIG. 1, after determining the stress control parameters, at step 106, a stack of layers comprising a substrate, an etch stop layer formed over the substrate, and an insulating layer formed over the etch stop layer is provided. Herein, the word 'provide' is used in a broad sense to encompass all modes of procuring the substrate, including, but not limited to, 'purchasing', 'preparing', 'manufacturing', 'arranging,' or 'making in order' the object of provision, which is a stack of layers as structured above.

Figure 4A:
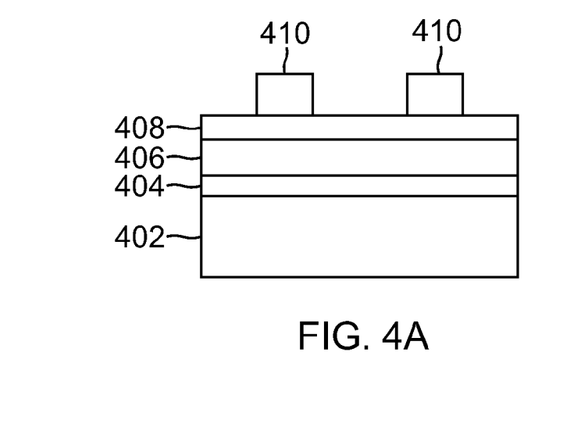
FIGS. 4A-4E schematically illustrate exemplary partial steps for forming trenches and trench sidewalls during the process illustrated in FIG. 1 in an aspect of the present disclosure.

FIG. 4A schematically shows such a stack of layers 400, including the substrate 402, the etch stop layer 404, and the insulating layer 406. The substrate 402 is not limited to the conventional narrowly meant substrate, comprising a single semiconducting material such as silicon and used for supporting semiconductor devices, but may encompass broad ranged structures. In one embodiment, the substrate 402 may include one or more interlayer dielectric layers (IDL) separating layers of interconnections. Or, the substrate 402 may include several levels of previously formed interconnecting wires and/or vias/contacts made of tungsten or other suitable metal for connection to the interconnecting wires of other levels or semiconductor devices below. In this case, the interconnecting wires to be formed through in the instant model semiconductor structure may be in fact the second, third, or higher level of interconnecting wires. In another embodiment, the substrate 402 may also contain a finished semiconductor devices such as MOSFET, a layer of phosphor-silicate glass (PSG) covering the devices, and/or a seal layer of silicon carbide (SIC).

In the present embodiment, the substrate 402 includes a silicon wafer. Alternatively or in addition, it may comprise other materials, including suitable elementary semiconductors such as germanium in crystal; a compound semiconductor, such as silicon carbide, gallium arsenic, gallium phosphide, indium phosphide, indium arsenide, and/or indium antimonide; or combinations thereof. The substrate 402 may also include an insulator layer on top of the semiconductor layer. The insulator layer comprises any suitable material, including silicon oxide, sapphire, other suitable insulating materials, and/or combinations thereof. An exemplary insulator layer may be a buried insulating layer (BOX). The insulator is formed by any suitable process, such as separation by implantation of oxygen (SIMOX), oxidation, deposition, and/or other suitable process. Alternatively, the substrate 402 may further include another semiconductor layer on top of an insulator layer to form a silicon-on-insulator (SOI) substrate, which can be fabricated using wafer bonding, and/or other suitable methods.

The substrate 402 may include various doped regions formed by an implantation process depending on design requirements as known in the art (e.g., p-type wells or n-type wells). The doped regions are doped with p-type dopants, such as boron or BF2; n-type dopants, such as phosphorus or arsenic; or combinations thereof. The doped regions may be formed directly on the substrate, in a P-well structure, in a N-well structure, in a dual-well structure, or using a raised structure. The semiconductor substrate may further include various active regions, such as regions configured for an N-type metal-oxide-semiconductor transistor device and regions configured for a P-type metal-oxide-semiconductor transistor device.

The etch stop layer 404 formed upon the substrate 402 is used essentially for two purposes. One is for preventing the copper interconnecting wires, which will be formed thereon, from diffusing into the dielectric material of the substrate below, and the other is for stopping the etchings. The etch stop layer 404 may be any non-conducting material to serve those purposes, such as titanium nitride (TiN), tantalum nitride (TaN), tungsten nitride (WN), titanium silicon nitride (TiSiN) or tantalum silicon nitride (TaSiN), silicon carbide (SiC), silicon nitride (SiN), NDC (nitrogen doped carbide), or ODC (oxygen doped carbide).

The insulating layer 406 may be formed by depositing a dielectric material. In one embodiment, the dielectric material may be low k (dielectric constant) material, having k value less than 3, such as fluorinated silica glass (FSG, k=2.8), hydrogen silsesquioxane (HSQ, k=2.9), carbon doped silicon oxide, amorphous fluorinated carbon (k=2.0), Parylene (k=2.4-2.7), B-stage polymers (k=2.6), BCB (bis-benzocyclobutenes), PTFE (Teflon, k=1.9), SiLK (Dow Chemical, Midland, Mich.), SiOC (silicon oxycarbide) polymers (k=2.0), polyimides/Fluorinated (k=2.9/2.3), Poly (arylene ether) PAE (k=2.6). In another embodiment, the dielectric material may be an ultra-low k dielectric material including a porous version of an existing dielectric material, such as Porous MSQ (k=1.8), Porous PAE (k=1.8), Porous SiLK (k=1.5), and Porous SiO$_2$ (k=1.1). In still another embodiment, the dielectric material may be the typical undoped and doped silicon dioxide (SiO2), silicon oxynitride (SiON), and silicon nitride (Si$_3$N$_4$). The low k dielectric material may be deposited by spin-on coating or spin-on dielectric (SOD) process, CVD, or any other suitable deposition processes. After the deposition, the upper portions of deposited dielectric layer may be removed by, in an embodiment, a CMP process. In some embodiment, the insulating layer may comprise more than one layer of different dielectric materials.

Referring again to FIG. 1, at step 108, a TiN hard mask layer 408 is formed upon the insulating layer 406 as shown in FIG. 4A. In the present disclosure, the TiN hard mask layer 408 is formed as a multi-layered structure by repetition of an identical sub-layer forming cycle of processes and the entire process is controlled such that the TiN hard mask layer 408 may have internal stress of a desired type and magnitude. More specifically, each TiN sub-layer forming cycle comprises two main processes: deposition of TiN and chlorine, and application of a N$_2$/H$_2$ plasma gas treatment to each TiN sub-layer. The number of total TiN sub-layers or the number of the cycles has been determined at step 104.

The first process in the TiN sub-layer forming cycle is deposition of TiN mixed with chlorine to form a TiN sub-layer with agent of nitrogen gas. The conventional methods of forming a TiN thin film is to use a physical vapor deposition (PVD) or chemical vapor deposition (CVD) process, in both of which, pure titanium is sublimated and reacted with nitrogen in a high-energy, vacuum environment, and no chlorine is used. In one embodiment of the present disclosure, by comparison, titanium and chlorine are deposited by a plasma-enhanced chemical vapor deposition (PECVD), a process used to deposit thin films from a gas state (vapor) to a solid state on a substrate. Chemical reactions are involved in the process, which occur after creation of plasma of the reacting gases. The plasma is generally created by RF (AC) frequency or DC discharge between two electrodes, the space between which is filled with the reacting gases. PECVD is especially advantageous for depositing films or layers conformally and yields some of the fastest deposition rates while maintaining film quality (such as roughness, defects/voids), as compared with sputter deposition and thermal/electron-beam evaporation, often at the expense of uniformity. But in other embodiments, titanium and chlorine gases may be deposited by any other known epitaxial growth process, including chemical vapor deposition (CVD), physical vapor deposition (PVD), molecular beam epitaxy (MBE), high density plasma CVD (HDPCVD), metal organic CVD (MOCVD), remote plasma CVD (RPCVD), Electro-less deposition, plating, or any suitable processes known in the art and/or combinations thereof. Such an epitaxy process may use either gaseous and/or liquid precursors.

In one embodiment, the titanium and chlorine is injected into the plasma chamber in a form of titanium chloride (TiCl$_4$) gas together with other reacting gases such as nitrogen (N$_2$), hydrogen (H$_2$), and argon (Ar) gases to form a TiN sub-layer that contains chlorine inside. In another embodiment, however, the titanium and chlorine may be flowed in separate gases. Furthermore, the present disclosure contemplates not only titanium as the metal/ceramic material for the hard mask. Any other suitable metallic or ceramic materials such as B$_x$N$_{1-x}$, Al$_x$N$_{1-x}$, Al$_x$O$_{1-x}$, Ti$_x$O$_{1-x}$, Cr$_{1-x}$N$_x$, Cr$_{1-x}$O$_x$ and Si$_x$N$_{1-x}$ . . . etc may be also used. Similarly, in other embodiments, other kinds of halogen gas may be used instead of chlorine. But the process disclosed in the present disclosure for forming a multi-layered hard mask while controlling its internal stress by utilizing repeated process cycles of PECVD-metal/ceramic deposition and a halogen gas plasma treatment remains the same.

Now, still at step 108, the other part in the TiN sub-layer forming cycle is application of a N$_2$/H$_2$ plasma treatment to each TiN sub-layer formed by deposition. During this process, nitrogen (N$_2$) and hydrogen (H$_2$) gas mixture are applied to the TiN sub-layer, just as in the PECVD Ti deposition stage, for a suitable duration (nitridation time), which has been previously determined at step 104. The difference of this plasma treatment stage from the previous deposition stage is that the plasma injection of the TiCl$_4$ gas is stopped during this plasma treatment stage. As described before, the hydrogen plasma gas in the N$_2$/H$_2$ plasma mixture chemically reacts with the chlorine in the TiN sub-layer to reduce the chlorine concentration in the TiN sub-layer by forming hydrogen chloride (HCl). And the nitrogen gas fills in where the chlorine is depleted in the in the TiN sub-layer.

By repeating predetermined number of the cycles of: TiN/chlorine deposition through a PECVD process and N$_2$/H$_2$ plasma treatment for a predetermined duration, the TiN sub-layers can be successively formed to form a multi-layered TiN hard mask. In one embodiment of present disclosure, the number of cycles of TiN/chlorine deposition through a PECVD process and N$_2$/H$_2$ plasma treatment, may be between 3 and 9 and the duration of nitridation in each cycle may range between 5 and 15 seconds. Such parameters may vary, of course, in other embodiments.

Referring again to FIG. 1, at step 110, a plurality of trenches may be further formed after the TiN hard mask is formed at step 108. FIGS. 4A-4E schematically illustrate exemplary steps for forming the trenches in an embodiment of the present disclosure. The trenches are defined into the insulating layer 406 to be subsequently filled with metal such as copper to form an interconnect level. Some trenches, which would form vias/contacts, may be defined deeper than the rest, past down the etch stop layer 404 and into the substrate 402 to reach another level of metal interconnects that may be formed in the substrate 402. The plurality of trench sidewalls, which interweave the plurality of trenches, are naturally formed by formation of the plurality of trenches, and each of the trench sidewalls has the TiN hard mask previously formed at step 108 at its top.

At step 110, the plurality of trenches may be formed by any suitable process, including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process may be implemented or replaced by other proper methods such as mask-less photolithography, electron-beam writing, and ion-beam writing.

More particularly, a photoresist ("PR") layer is coated upon the TiN hard mask layer 408 for patterning. The photoresist may be any suitable material used in the art, such as Poly (methyl methacrylate) (PMMA), Poly (methyl glutarimide) (PMGI), Phenol formaldehyde resin (DNQ/Novolac), SU-8, and may be either positive or negative photoresist. These materials are all applied as a liquid and, generally, spin-coated to ensure uniformity of thickness. After prebaking, the photoresist layer is exposed to an ultraviolet (UV), deep ultraviolet (DUV) or electron beam through a pattern via a photomask. The exposure to light causes a chemical change that allows some of the photoresist to be removed by a special solution, called "developer" by analogy with photographic developer. For positive photoresist, the most common type, the exposed part becomes soluble in the developer. After going through a post-exposure baking process, the remaining (unexposed) parts form a mask that resists etching. FIG. 4A shows such photoresist masks 410 after the exposure, developing, and post-exposure baking process.

Figure 4B:
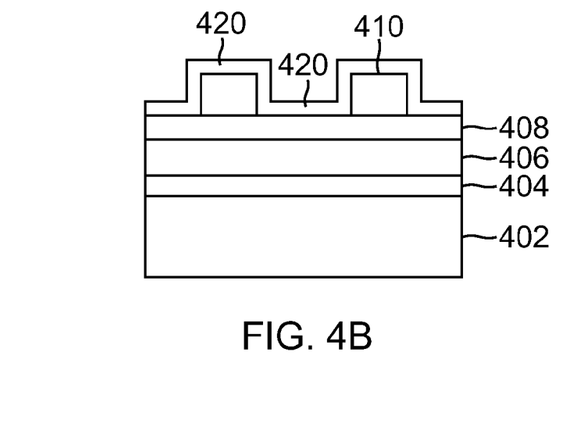

Next, a dielectric material 420, such as $SiO_2$, SiC, or $SiNi_4$, may be deposited, as shown in FIG. 4B, by a suitable deposition process, such as chemical vapor deposition (CVD), physical vapor deposition (PVD), or molecular beam epitaxy (MBE), upon the TiN hard mask layer 408 and the photoresist masks 410 to form spacers for the trenches. An etching is then performed upon the spacer layer 420 to remove top and bottom portions of the spacer layer 420. Here, any known etching processes may be used, such as wet etching, dry etching, or plasma etching, but when an anisotropic etching is desired, a plasma etching may be used. The etchants that may be used may include, but are not limited to, wet etchants such as potassium hydroxide (KOH), ethylene diamine and pyrocatechol (EDP), or Tetramethylammonium hydroxide (TMAH), or plasma etchants such as $Cl_2$, $CCl_4$, $SiCl_2$, $BCl_3$, $CCl_2F_2$, $CF_4$, $SF_6$, or $NF_3$.

Figure 4C:
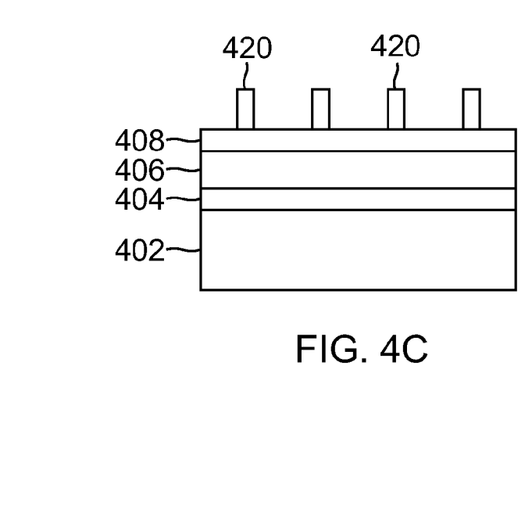
Figure 4D:
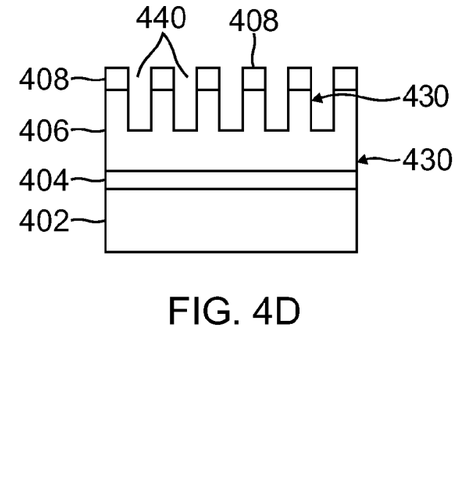

After etching portions of the spacer layer 420, the photoresist masks 410, which are no longer needed, are removed by a process called ashing. This usually requires a liquid "resist stripper", which chemically alters the resist so that it no longer adheres to the TiN hard mask layer 408. Alternatively, the photoresist masks 410 may be removed by a plasma containing oxygen, which oxidizes it. FIG. 4C shows the remaining portions of the spacer layer 420, after the etching and ashing processes, which form the substantially equal-spaced first spacers 420. Next, another etching process is performed into the insulating layer 406, past the TiN hard mask layer 408. The etching stops at the etch stop layer 404. The portions of the insulating layer 406 and the TiN hard mask layer 408 that are located directly under the spacers 420 will survive the etching to form trench sidewalls 430, and the etched-out portions of the insulating layer 406 and the TiN hard mask layer 408 forms the plurality of trenches 440 as shown in FIG. 4D. Again, any known etching processes may be used, such as wet etching, dry etching, or plasma etching. The etchants that may be used may include, but are not limited to, wet etchants such as potassium hydroxide (KOH), ethylene diamine and pyrocatechol (EDP), or Tetramethylammonium hydroxide (TMAH), or plasma etchants such as $Cl_2$, $CCl_4$, $SiCl_2$, $BCl_3$, $CCl_2F_2$, $CF_4$, $SF_6$, or $NF_3$. Thereafter, the spacers 420 are removed by another etching process.

Figure 4E:
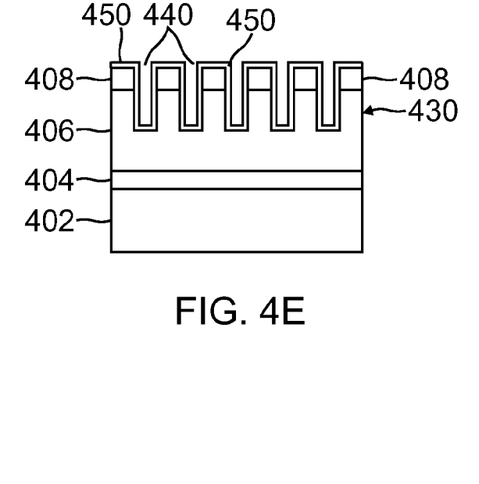

Referring again to FIG. 1, at step 112, an anti-diffusion barrier film is formed, as shown in FIG. 4E, upon the plurality of trenches 440 and trench sidewalls 430. The anti-diffusion barrier film 450 is used to avoid diffusion of the copper that is to be filled into the trenches 440 to form interconnects and visa into the surrounding materials, the insulating layer 406 that could be made of low k or ultra-low k dielectric material and substrate 402. It also prevents copper contamination by elements diffusing from the insulating layer 406. The barrier film 450 should be pure, dense, conductive, conformal, thin, and have good adhesion towards metals and insulating materials. Commonly used anti-diffusion barrier materials are transition-metal nitrides, such as titanium nitride (TiN), tantalum nitride (TaN), tungsten nitride (WN), titanium silicon nitride (TiSiN), tantalum silicon nitride (TaSiN), or ceramic materials.

The thickness of the anti-diffusion barrier film 450 should be well controlled because if it is too thin, the diffused copper would poison the very devices that they connect to, and if it is too thick, it may burden the TiN hard mask with extra stress.

In one embodiment, the anti-diffusion barrier film 450 may be formed by atomic layer deposition (ALD), a thin film deposition technique based on the sequential use of a gas phase chemical process. The majority of ALD reactions use two chemicals, typically called precursors, which react with a surface one at a time in a sequential manner. By exposing the precursors to the growth surface repeatedly, a thin film is deposited. The modern technique of ALD film growth makes possible atomic scale deposition control, as fine as ~0.1 Å (10 pm) per cycle.

One of the broader forms of the present disclosure involves a method of fabricating a semiconductor device. The method comprises providing a stack of layers comprising a substrate, an etch stop layer formed over the substrate, and an insulating layer formed over the etch stop layer; and forming a titanium nitride (TiN) hard mask over the insulation layer. The TiN hard mask comprises one or more sub-layers and each sub-layer is successively formed by a cycle of processes comprising depositing TiN mixed with chlorine and performing a plasma gas treatment. The TiN mixed with the chlorine may be deposited in a $TiCl_4$ Gas by a plasma enhanced chemical vapor deposition (PECVD). The plasma gas treatment may use a mixture of nitrogen ($N_2$) and hydrogen ($H_2$) gas. The concentration of the chlorine may be controlled by controlling a duration of the plasma gas treatment in the each cycle, and in an embodiment, between about one and about ten atomic percent. The method may further comprise forming on the stack of layers a plurality of trenches extending into the insulation layer, thereby leaving a plurality of trench sidewalls interweaving the trenches and forming an anti-diffusion barrier film over the plurality of trenches and the plurality of trench sidewalls.

Another of the broader forms of the present disclosure involves a method of fabricating a semiconductor device. The method comprises determining external stress to be exerted on a model TiN hard mask in a model semiconductor structure, which includes: a model insulating layer and a plurality of model trenches defined into the model insulating layer thereby to define a plurality of interweaving model trench sidewalls, where each of the model trench sidewalls includes the model insulating layer, the model TiN hard mask formed over the model insulating layer, and a model anti-diffusion barrier film formed over the model TiN hard mask; determining a number of TiN sub-layers, and a duration of a plasma gas treatment to be performed in the formation of each of the TiN sub-layers, wherein the determination is made in such a way that when a TiN hard mask is formed in accordance with the TiN sub-layer number and the duration of a plasma gas treatment, the TiN hard mask will have an internal stress that counter-balances an external stress; providing a stack of layers including: a substrate; an etch stop layer formed over the substrate; and an insulating layer formed over the etch stop layer; and forming a TiN hard mask over the insulation layer, wherein the TiN hard mask comprises TiN sub-layers of the determined TiN sub-layer number, and wherein each of the TiN sub-layers is successively formed by depositing TiN mixed with chlorine, and treating the deposited TiN sub-layer with a plasma gas for the determined duration. The duration of a plasma gas treatment may be determined in consideration of a relation between the internal stress of the TiN hard mask and a concentration of the chlorine. The TiN mixed with the chlorine may be deposited in a $TiCl_4$ Gas by a plasma enhanced chemical vapor deposition (PECVD). The plasma gas treatment may use a mixture of nitrogen ($N_2$) and hydrogen ($H_2$) gas. The concentration of the chlorine may be controlled by controlling a duration of the plasma gas treatment in the each cycle, and in an embodiment, between about one and about ten atomic percent. The number of TiN sub-layers may be determined in consideration of a relation between internal stress of the TiN hard mask and a number of TiN sub-layers. The method may further comprise forming on the stack of layers a plurality of trenches extending into the insulation layer, thereby leaving a plurality of trench sidewalls interweaving the trenches and forming an anti-diffusion barrier film over the plurality of trenches and the plurality of trench sidewalls.

Still another of the broader forms of the present disclosure involves a method of fabricating a semiconductor device. The method comprises providing a substrate including an insulating layer formed over an etch stop layer; and forming a titanium nitride (TiN) hard mask over the insulation layer, by sequentially performing the steps of: depositing a first layer of TiN mixed with chlorine; performing a first plasma gas treatment; depositing a second layer of TiN mixed with chlorine; and performing a second plasma gas treatment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    determining a number of a metal nitride sub-layers and a duration of a treatment process to be performed in the formation of each of the metal nitride sub-layers, wherein the determination is made in such a way that when a hard mask is formed in accordance with the metal nitride sub-layer number and the duration of the treatment process, the hard mask will have an internal stress that counter-balances an external stress to be exerted on the hard mask to be formed over a substrate; and
    forming the hard mask over the semiconductor substrate, wherein the hard mask is formed of the number of determined metal nitride sub-layers and wherein each of the metal nitride sub-layers is successively formed by a cycle of processes that includes depositing a metal nitride and performing treatment process for the determined duration.

2. The method of claim 1, wherein the metal nitride includes titanium nitride (TiN).

3. The method of claim 1, wherein depositing the metal nitride includes depositing the metal nitride mixed with a halogen gas.

4. The method of claim 1, further comprising forming a patterned material layer over the hard mask; and
    etching the hard mask using the patterned material layer as a mask.

5. The method of claim 1, wherein the internal stress is a tensile stress and the external stress is a compressive stress.

6. The method of claim 1, wherein the internal stress is a compressive stress and the external stress is a tensile stress.

7. The method of claim 1, wherein the treatment process includes a gas treatment process.

8. A method comprising:
    determining a number of a metal nitride sub-layers and a duration of a treatment process to be performed in the formation of each of the metal nitride sub-layers, wherein the determination is made in such a way that when a hard mask is formed in accordance with the metal nitride sub-layer number and the duration of the treatment process, the hard mask will have an internal stress that counter-balances an external stress to be exerted on the hard mask to be formed over a substrate;
    forming a dielectric layer over the semiconductor substrate;
    forming the hard mask over the dielectric layer, wherein the hard mask is formed of the number of determined metal nitride sub-layers and wherein each of the metal nitride sub-layers is successively formed by a cycle of processes that includes depositing a metal nitride and performing treatment process for the determined duration;
    patterning the hard mask layer; and
    patterning the dielectric layer while using the patterned hard mask layer as a mask.

9. The method of claim 8, wherein the metal nitride is selected from the group consisting of titanium nitride, aluminum nitride, and chromium nitride.

10. The method of claim 8, wherein the treatment process includes performing a nitridation process.

11. The method of claim 10, wherein the nitridation process uses a mixture of nitrogen ($N_2$) and hydrogen ($H_2$) gas.

12. The method of claim 8, wherein the insulating layer is a low-k dielectric layer.

13. The method of claim 8, wherein depositing the metal nitride includes depositing the metal nitride with a halogen material, and
    wherein the depositing of the metal nitride with the halogen material is deposited by plasma enhanced chemical vapor deposition (PECVD).

14. The method of claim 8, wherein the treatment process is the same for each of the number of determined metal nitride sub-layers.

15. A method comprising:
    determining a number of sub-layers for a hard mask and a duration of a treatment process to be performed in the formation of each of the sub-layers, wherein the determination is made in such a way that when the hard mask is formed in accordance with the sub-layer number and the duration of the treatment process, the hard mask will have an internal stress that counter-balances an external stress to be exerted on the hard mask to be formed over a substrate; and
    forming the hard mask over the semiconductor substrate, wherein the hard mask is formed of the number of determined sub-layers and wherein each of the sub-layers is successively formed by a cycle of processes that includes depositing a material and performing treatment process for the determined duration, wherein the material is selected from the group consisting of a metal nitride material and a ceramic material.

16. The method of claim 15, wherein the material selected is the metal nitride material, and
    wherein the metal nitride material is selected from the group consisting of titanium nitride, aluminum nitride, and chromium nitride.

17. The method of claim 15, wherein the material selected is the ceramic material, and
    wherein the ceramic material is selected from the group consisting of boron nitride, aluminum oxide, titanium oxide, chromium oxide, and silicon nitride.

18. The method of claim 15, wherein depositing the material includes depositing the material with a halogen material.

19. The method of claim 15, further comprising:
forming an insulating layer over the semiconductor substrate prior to forming the hard mask;
patterning the hard mask;
forming a trench within the insulating layer while using the patterned hard mask as a mask; and
forming an anti-diffusion barrier layer in the trench.

20. The method of claim 19, further comprising forming an etch stop layer over the semiconductor substrate prior to forming the insulating layer, and
wherein the trench is formed within the insulating layer without extending to the etch stop layer.

\* \* \* \* \*